(12) United States Patent
Fraer et al.

(10) Patent No.: US 7,203,631 B2
(45) Date of Patent: Apr. 10, 2007

(54) SYSTEM AND METHOD TO ANALYZE VLSI DESIGNS

(75) Inventors: Ranan Fraer, Haifa (IL); Osnat Weissberg, Haifa (IL); Amitai Irron, Kibbutz Barkai (IL); Gila Kamhi, Zichron Yaakov (IL); Marcelo Glusman, Maalot (IL); Sela Mador-Haim, Binyamina Area (IL); Moshe Y. Vardi, Bellaire, TX (US)

(73) Assignee: Intel Corporation, Santa Clara, CA (US)

( * ) Notice: Subject to any disclaimer, the term of this patent is extended or adjusted under 35 U.S.C. 154(b) by 747 days.

(21) Appl. No.: 10/334,113

(22) Filed: Dec. 31, 2002

(65) Prior Publication Data

US 2004/0049371 A1 Mar. 11, 2004

Related U.S. Application Data

(60) Provisional application No. 60/408,866, filed on Sep. 9, 2002.

(51) Int. Cl.
*G06F 17/50* (2006.01)
(52) U.S. Cl. .................. 703/14; 703/2; 703/3; 703/17; 716/3; 716/4; 716/5
(58) Field of Classification Search .................. 703/26, 703/14, 17, 2, 3; 716/4, 5, 3; 717/124
See application file for complete search history.

(56) References Cited

U.S. PATENT DOCUMENTS 6,185,516 B1 * 2/2001 Hardin et al. .................. 703/2
6,247,163 B1 * 6/2001 Burch et al. .................... 716/3
6,618,841 B1 * 9/2003 Huang ............................. 716/4
6,691,078 B1 * 2/2004 Beer et al. ..................... 703/14
6,751,582 B1 * 6/2004 Andersen et al. ............. 703/14
6,848,088 B1 * 1/2005 Levitt et al. .................... 716/4
6,975,976 B1 * 12/2005 Casavant et al. ............. 703/14
2002/0055829 A1 * 5/2002 Rajan ............................ 703/17
2002/0095645 A1 * 7/2002 Rodeh ............................ 716/4
2002/0138812 A1 * 9/2002 Johannsen ...................... 716/5
2002/0144236 A1 * 10/2002 Beer et al. .................. 717/124
2003/0182638 A1 * 9/2003 Gupta et al. .................... 716/4
2005/0043935 A1 * 2/2005 Dreschsler et al. ........... 703/13

OTHER PUBLICATIONS

E.M. Clarke et al., "Efficient Generation of Counterexamples and Witnesses in Symbolic Model Checking", 32nd ACM/IEEE Design Automation Conference, 1996, pp. 1-6.

(Continued)

*Primary Examiner*—Paul Rodriguez
*Assistant Examiner*—K Thangavelu
(74) *Attorney, Agent, or Firm*—Pearl Cohen Zedek Latzer, LLP.

(57) ABSTRACT

Briefly, a system and a method of formal verification and failure analysis and rectification of models or designs, e.g., VLSI designs, of processors, circuits and logical systems. Embodiments of the system may include a multi-value annotation scheme for annotating different types of values of signals, and a post-annotation scheme for further analysis based on the annotated values. Some embodiments of the invention may optionally include a generator of counter-examples of a given length.

29 Claims, 3 Drawing Sheets

OTHER PUBLICATIONS

Scott Hazelhurst and Carl-Johan H. Seger, "Symbolic Trajectory Evaluation", T. Kropf (E), Formal Hardware Varification; Methods and Systems in Comparison, LNCS 1287, Springer-Verlag, Berlin, Aug. 1997, pp. 1-69.

Dong Wang et al., "Formal Property Verification by Abstraction Refinement with Formal, Simulation and Hybrid Engines", Proceedings of DAC, 2001, pp. 1-6.

Edmund Clarke et al., "Counterexample-Guided Abstraction Refinement", Proceedings of CAV, 2000, pp. 1-16.

Ranan Fraer et al., "Evaluating Semi-Exhaustive erification Techniques for Bug Hunting", Proceedings of SMC, 1999, pp. 1-11.

* cited by examiner

SYSTEM AND METHOD TO ANALYZE VLSI DESIGNS

CROSS-REFERENCE TO RELATED APPLICATIONS

The present Patent Application claims priority from U.S. Provisional Application Ser. No. 60/408,866, filed Sep. 9, 2002.

BACKGROUND OF THE INVENTION

In the Very Large-Scale Integration (VLSI) design industry, there are known procedures for detecting and rectifying logical defects in the design of processors, VLSI components, and various logical systems. Some formal verification methods are based on symbolic model checking, which is often limited with respect to the size of verifiable designs. In symbolic model checking, the concrete design is abstracted into a simpler design that has a smaller state space. The abstract design is typically an over-simplification of the concrete design, such that the abstract design often allows behaviors that are not allowed in the concrete design. This results in false negatives, as well as spurious counter-examples. In addition, present symbolic model checkers usually provide oily a single counter-example as the output of a failing verification. Furthermore, present symbolic model checkers cannot provide all the counter-examples of a given length as the output of a failing verification.

Other known methods of formal verification are based on Symbolic Trajectory Evaluation (STE) and symbolic simulation. In an STE model checker, counter-example information may be obtained from a failed run: the counter-example may be either symbolic, representing substantially all traces for which a property failed; or it may be a scalar representing only one trace for which the property failed. An STE model checker may also be designed to symbolically represent only a portion of the traces by constraining some of the values during the simulation. However, an STE model checker has limitations, for example: it may handle only a restricted class of properties; it may not handle arbitrary temporal properties; and it may not use some logical operators, e.g., disjunction.

There is no prior art method or apparatus to extract information on effectively all counter-examples of a given length on a symbolic model checking based run. Additionally, there is a need for solutions to produce various groups of counter-examples, e.g., counter-examples that may be used to debug and refine failures or to improve current abstractions.

BRIEF DESCRIPTION OF THE DRAWINGS

The present invention will be understood and appreciated more fully from the following detailed description of preferred embodiments of the invention taken in conjunction with the accompanying drawings in which.

DETAILED DESCRIPTION OF THE INVENTION

In a formal verification process, a user, for example, a VLSI engineer, may currently be required to perform a sequential process repeatedly until the process converges. The sequential process may comprise, for example, specifying, verifying, producing a counter-example for, and analyzing and/or fixing a model or a specification based on the counter-example. As will be explained in further detail hereinbelow, some embodiments of the present invention may automate and/or shorten parts of the process, allowing the user to obtain substantially all the counter-examples of a given length and to perform a root-cause analysis in one step without repeating operations over and over. Since a user may often have to produce and analyze up to thousands of counter-examples for one model, a system and method according to some embodiments of the present invention may represent a significant savings in time and effort.

A "length" of a counter-example may be defined as the number of phases in a trace of the counter-example. Embodiments of the present invention may obtain and analyze effectively all the counter-examples of a given length.

Embodiments of the present invention provide solutions to the counter-example diagnosis problems described above, for example, by introducing a concise and intuitive representation of counter-example data, hereinafter referred to as "Multi-value counter-example Annotation" (MCA). The MCA according to embodiments of the invention utilizes the exhaustive nature of symbolic model checking, and has the ability to represent effectively all the counter-examples of a given length. Furthermore, according to embodiments of the present invention, a value of a signal at a phase of a trace may be annotated by determining a type of influence of the signal on a property, as explained in detail herein.

Figure 1:
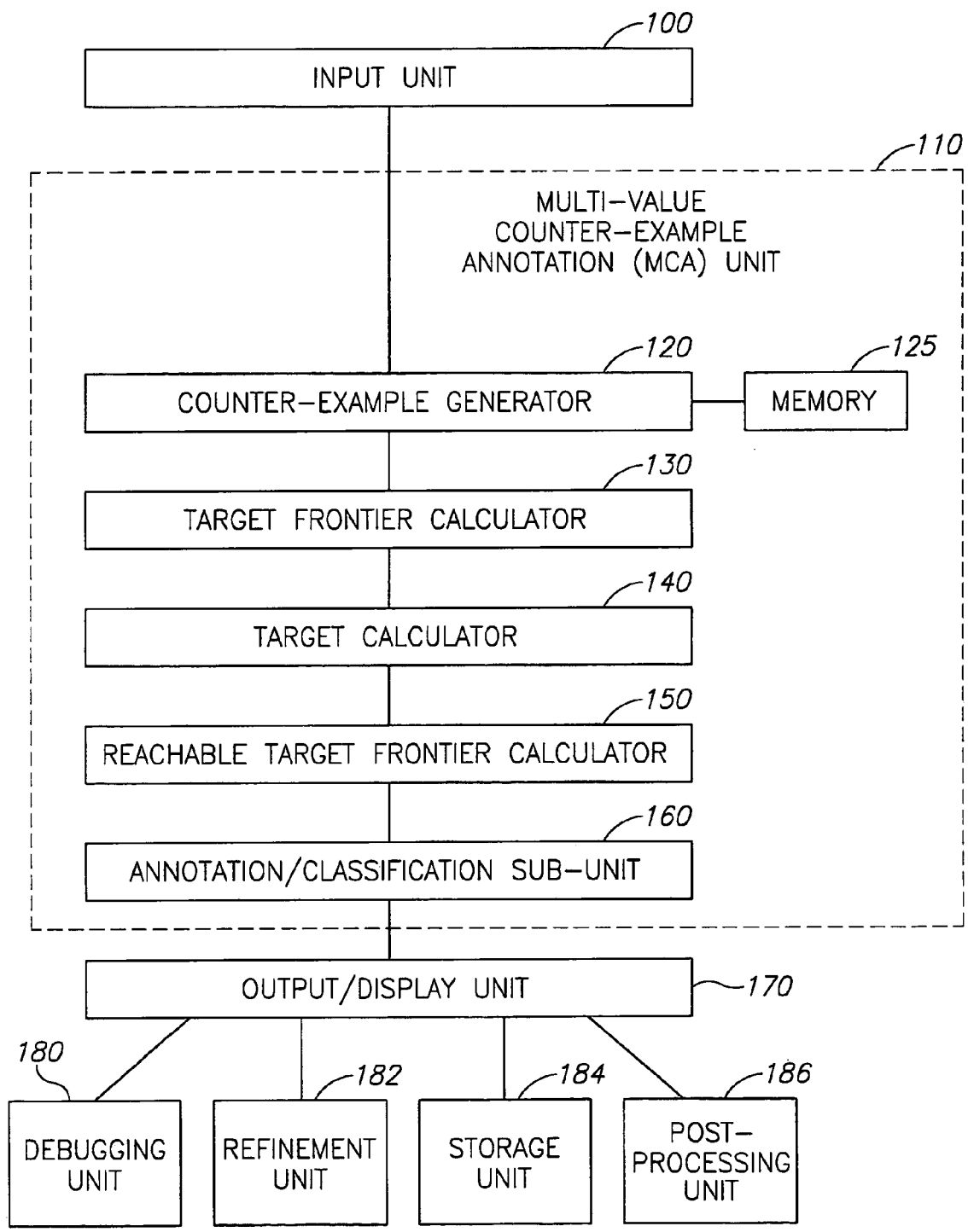
FIG. 1 is a schematic flowchart depicting a system according to an exemplary embodiment of the present invention.

Exemplary embodiments of the invention may receive an input and produce an output. FIG. 1 schematically illustrates a system according to an exemplary embodiment of the present invention. Although the scope of the present invention is not limited in this respect, embodiments of the present invention may include an Input Unit 100, which may include, for example, a keyboard, a mouse, a terminal, a personal computer, a laptop computer, a pointing device, a scanner, a light-pen, or any other suitable input devices as are known in the art, and may be implemented using hardware and/or software. In some embodiments of the invention, the Input Unit 100 may include a separate unit, which may be implemented by software and/or dedicated hardware, internally or externally with respect to the rest of the system. Input Unit 100 may receive an input, which may include:

(a) a Model to be verified, which may include, but is in no way limited to, a model compiled from a VLSI design; and (b) a Formal Specification, which may include one or more properties to be checked.

Additionally, although the scope of the present invention is not limited in this respect, embodiments of the present invention may use an Output/Display Unit 170 to produce and/or display an output. The Output/Display Unit 170 may include, for example, a monitor, a computer screen, a laptop screen, a panel, a terminal, a printing device, a computer file, or any other suitable output devices as are known in the art, and may be implemented using hardware and/or software. In some embodiments of the invention, the Output/Display Unit 170 may include a separate unit, which may be implemented by software and/or dedicated hardware, internally or externally with respect to the rest of the system. Output Unit 170 may re-route and/or transmit and/or display and/or otherwise reproduce an output, which may include:

(a) the status of a property to be checked;
(b) for each failed property, a representation of multiple counter-examples, for example, effectively all the counter-examples of a given length, which representation may be in a format suitable for performing additional tasks such as, for example, manipulation, query, analysis, storage, logging, debugging, and/or refinement;
(c) all, or effectively all, or several of, the counter-examples of a given length;
(d) post-classification data or post-annotation data, as obtained by classification and/or annotation in accordance with some embodiments of the present invention as described herein.

It is noted that an exemplary embodiment of the present invention may use a Binary Decision Diagram (BDD), or several BDDs, in order to represent input data, output data, e.g., counter-examples, and/or to facilitate manipulation or storage of data. It should be appreciated that the use of BDDs in the context of the exemplary implementations of the present invention, as described herein, is in no way intended to limit the scope of the present invention. Other suitable formats of data representation are also within the scope of the present invention.

Although the scope of the present invention is in no way limited in this regard, the following definitions may be used throughout the detailed description of exemplary embodiments of the present invention:

(a) A "state" may be a possible configuration of the model being verified, and may be defined by assigning a "0" or "1" value to each Boolean variable in the model. Symbolic model checking is typically used to manipulate sets of states, which may be represented by BDDs, or other suitable representations.
(b) An "invariant" may be a property to be checked, e.g., a "safety" property, as is know in the art.
(c) A "non-empty intersection" between two sets of states occurs when there is at least one state common to both sets of states.
(d) An "image", or a "forward image", of a set of states, S, is a set of states, S1, that have a predecessor in S.
(e) A "PreImg", or a "backward image", of a set of states, S, is a set of states, S2, that have a successor in S.
(f) A "frontier" is a set of new states visited at each step in a traversal of a trace. A frontier may be a "forward frontier" or a "backward frontier", in accordance with the direction of traversal.
(g) A "fixed point" occurs when there are no new states for a frontier to acquire, i.e., when a frontier is empty. When a fixed point is reached, the traversal may end.

A MCA Unit 110 in accordance with embodiments of the present invention is schematically illustrated in F*ig*. 1. The MCA Unit 110 may include, for example:

(a) an optional Counter-example Generator 120, to generate counter-examples as detailed herein;
(b) a Target Frontier Calculator 130, to calculate Target Frontiers as detailed herein;
(c) a Target Calculator 140, to calculate Targets as detailed herein;
(d) a Reachable Target Frontier Calculator 150, to calculate Reachable Target Frontiers as detailed herein; and
(e) an Annotation/Classification Sub-Unit 160, to annotate and/or classify signal values as detailed herein.

(f) An optional external or internal memory 125, which may be used to store data to be used at various stages of the annotation process in accordance with some embodiments of the invention. For example, the memory may store data representing BDDs of models, specifications, Target Frontiers, counter-example, or any other data that may be useful for various stages of annotation processes, pre-annotation processes or post-annotation processes, as detailed herein.

It is noted that embodiments of the present invention may implement the above sub-units of the MCA 110 as separate, dedicated, internal, external or embedded sub-units, using one or more hardware devices, e.g., processing units, and/or one or more software applications. In some embodiments of the invention, the functions of units 130, 140, 150, 160, as well as the optional counter-example generator 120, if used, are all performed by software operated on a computer, for example, a personal desktop or laptop computer.

As illustrated schematically in FIG. 1, embodiments of the present invention may also include:

(a) a Debugging Unit 180, to debug a model;
(b) a Refinement Unit 182, to refine a model;
(c) a Storage Unit 184, to store and/or restore data which was produced and/or used by MCA Unit 110; and
(d) a Post-Processing Unit 186, to perform other desirable tasks using the data generated by MCA Unit 110.

It is noted that embodiments of the present invention may implement the above sub-units as separate, dedicated, internal, external or embedded sub-units, using one or more hardware devices (e.g., processors) and/or software applications. In some embodiments, the functions of any or all of units 180, 182, 184 and 186 may be performed by appropriate software operating on a computer, for example, a personal desktop or laptop computer.

Figure 2:
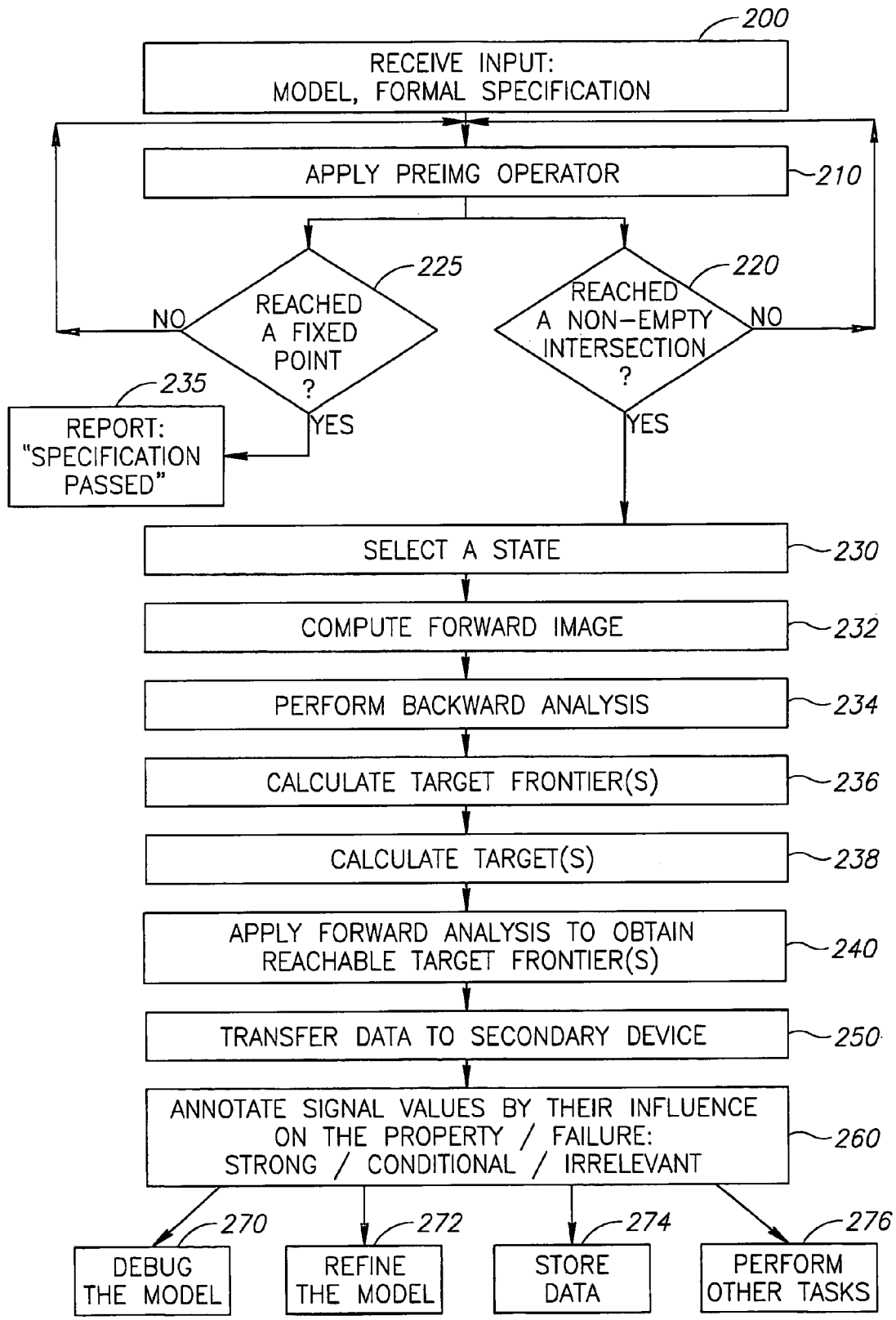
FIG. 2 is a schematic flowchart depicting a method according to an exemplary embodiment of the present invention.

FIG. 2 schematically illustrates a method according to ail exemplary embodiment of the invention. As indicated at block 200, the method may begin by receiving an input, which may include, for example, a Model and a Formal Specification. The input may be in any of various suitable formats, as are known in the art, and the type of formats may depend on the specific application of the method of some embodiments of the invention. For example, although the scope of the invention is not limited in this respect, VLSI designs may be suitable input models for hardware verification implementations. Such VLSI designs may be described in a Hardware Description Language (HDL) such as, for example, VHDL or Verilog. For software verification, the input model may be a software program, written in a programming language such as, for example, C, C++, Java, etc., if desired. Formal Specification inputs may be written in a Formal Specification Language, e.g., as a separate file, i.e., independently of the model. Examples of such languages include but are not limited to ForSpec or Sugar, as are known in the arts. The specification may also be embedded in a design in the form of design assertions, which may be written in assertion languages such as, for example, OVL (Verplex).

In order to produce a counter-example, the following algorithm, Algorithm 1, which is a non-limiting example of a method of counter-examples generation in accordance with embodiments of the invention, may be applied to the input described above. It should be appreciated that Algorithm 1 is given as an example only; in alternate embodiments of the invention, other algorithms, for example, algorithms in accordance with specific design requirements, may be used in addition to or instead of Algorithm 1 to perform similar functions. Algorithm 1 in accordance with an exemplary embodiment of the invention may be as follows:

```
COUNTER-EXAMPLE-GENERATION (δ, S₀, p)
i = 0;
Target = F₀ = {pi | pi does not satisfy p}; // F₀ represents all the states that do not satisfy p
C = { } // Counter-example is initialized to an empty list
While (F_i 16 Ø) {
    F_{i+1} = PRE-IMG(δ, Fi);
    if (F_{i+1} ∩ S₀ ≠ Ø) { // the property is violated
        F_{i+1} = F_{i+1} ∩ S₀;
            j = i;
        while (j >= 0) {
        s = SELECT_STATE(F_{j+1});
        F_j = Img(δ, s) ∩ F_j;
        j = j - 1;
        C = PUSH(s,C);
        }
        return REVERSE(C); // return a counter-example
    } //end the property is violated
    i = i+ 1;
    F_i = F_i - Target;
    Target= Target U F_i,
}
// the property is satisfied
return C;
```

Algorithm 1 may be applied to the input, in order to produce counter-examples, for states that do not satisfy an invariant, which may be denoted $F_0$.

According to Algorithm 1, and as indicated at block 210, a PreImg operator may be applied to the input repeatedly until one of the following points is reached:

(a) a fixed point; or (b) a non-empty intersection (i.e., $F_{i+1} \cap S_0 \neq \emptyset$) of the last backward frontier with the initial states.

If condition (a) is met, i.e., if a fixed point is reached, as indicated at block 225, the conclusion should be that the specification holds in the model being investigated, i.e., that there is no counter-example. At that point the algorithm may stop and may report a "specification passed" indication. If condition (b) is met, i.e., if a non-empty intersection is reached, as indicated at block 220, a state may be selected from the states in the non-empty intersection, for which there is a path to the states that complement (i.e., violate) the invariant, as indicated at block 230. This may be performed by extracting a trace from the initial states to the states that complement the invariant, and then selecting a single state from each frontier of the frontiers computed by the PreImg operator at block 210. These frontiers may be stored, for example, in the form of BDDs, and may be arranged, for example, in the order at which they were encountered. The BDDs may be stored, for example, in memory 125 (FIG. 1), and each stored BDD may represent a set of states. A simple function may be applied to extract a single state from the set.

Then, as indicated at block 232, a forward image of the selected state may be computed, e.g., using methods as are known in the art, for example, iteratively intersecting a series of forward frontiers with their corresponding backward frontiers, and choosing a representative state from each intersection for the corresponding phase in the counter-example being generated. It will be appreciated by persons skilled in the art that the mathematical functionality of blocks 234, 236 and 238 may be substantially analogous to the mathematical functionality of blocks 210, 220 and 225. For example, both sets of functions may perform similar backward analyses of their inputs. It will be father appreciated that the functionality of blocks 210, 220, 230, 232 may be carried out as part of a separate, preliminary algorithm, independently of the annotation method of some embodiments of the present invention. Thus, some embodiments of the method of the present invention may begin at block 234, as described below, and the inputs of such embodiments may be in the form of forward images of selected states, as described above.

As indicated at block 234, backward analysis may be performed, starting from error states, i.e., states that violate the invariant, and the PreImg operator may be applied iteratively until an intersection with the initial states is reached. "Target Frontiers" may be defined as sets of states obtained by the backward analysis, and may be calculated as indicated at block 236.

The nth Target Frontier, $F_n$, may be defined as the set of states from which an error state may be reached in n, but not less than n, iterations of the PreImg operator:

$$F_0 = \neg \text{ Invariant} \qquad \text{Equation 1}$$

$$F_{n+1} = PreImg(F_n) - \bigcup_{i=1}^{n} Fi$$

In the following equation, N denotes the index of the last Target Frontier before the fixed-point, i.e., the first index to satisfy the following equation:

$$F_{N+1} = F_N \qquad \text{Equation 2}$$

In some exemplary embodiments of the present invention, the Target Frontiers may be calculated using Equation 1 and Equation 2 as detailed above. Target Frontiers may be disjoint, and their union may be denoted "Target". The Target may represent effectively all the states from which a state violating the invariant may be reached. The Target may be calculated as indicated at block 238:

$$\text{Target} = \bigcup_{i=1}^{N} Fi \qquad \text{Equation 3}$$

In Algorithm 1, the frontiers $F_0, F_1, \ldots F_N$ may represent the Target Frontiers. It is noted that the set of all N Target Frontier may represent effectively all the counter-examples of a given length, although the scope of the invention is not limited in this regard. In embodiments of the invention, Algorithm 1 may be used to calculate counter-examples, while Algorithm 2, given below, may be used to calculate Target Frontiers.

In some embodiments of the invention, an input of previously prepared data representing counter-examples may additionally or alternatively be received and/or used as input to MCA 110. Such input may be received from any source, which may include but is in no way limited to a separate system, a secondary memory, a buffer, a register, a storage device, a hardware device, a software application, a generating device, a pre-prepared list of counter-examples, a computer file, a data collection, a database, a hard disk, a computer network, a global computer network, a printout, a manual input by a user, a batch of counter-examples prepared either beforehand or dynamically in real-time by humans or automatically, or from any other sources.

As indicated at block 240, once the Target Frontiers have been calculated, Algorithm 2 below may be additionally applied to filter out states that are unreachable from $F_N \cap S_0$ in each of the Target Frontiers. Such filtering may be achieved by applying forward analysis, as defined above, starting from the states in the set $F_N \cap S_0$.

As indicated at block 240, the forward analysis may be applied in order to obtain only the reachable (i.e., legal) states in the Target Frontier. The forward analysis may start with the first Target Frontier and iteratively apply the Image operator, to compute successor states, while intersecting with the other Target Frontiers. Each of the Target Frontiers remaining after the forward analysis may be hereinafter denoted "Reachable Target Frontier" (RTF). Algorithm 2, in accordance with an exemplary embodiment of the invention, may be as follows:

It should be noted that the resulting RTFs may have the following two characteristics, which may be useful in a debugging or refinement process:
(a) Any trace of a signal through an RTF may represent a counter-example.
(b) All possible counter-examples in this verification of length N, where N is the number of Target Frontiers, may be included in the RTFs.

Hence, the RTFs may store substantially all the information needed for querying and extraction of counter-examples, as discussed below, enabling a concise and flexible handling of the counter-examples.

As indicated at block 250, in some embodiments of the present invention, the model checker may transfer, copy, dump, or upload data representing the RTFs into a secondary device. The data representation may be in any suitable format, including but in no way limited to BDDs. The secondary device may be any suitable device, including but in no way limited to a secondary memory, a computer file, a database, a data collection, a list, a storage device, a server, a backup device, a magnetic or optical storage medium, a buffer, a register, a printout, a hard disk, a computer network, a global computer network, a hardware device, a software application, or other targets or media.

In some embodiments of the invention, the secondary device may allow further, more refined, manipulation of data (for example, the BDDs) or the RTFs. Specifically, as indicated respectively at blocks 270, 272, 274 and 276, such manipulation may include debugging, refinement, storage, or other tasks. In addition, interactive debugging may be performed by storing and/or restoring the RTFs in an interactive environment. Further, the RTFs may be queried using a programming language or a functional language, for example, Lisp, Scheme, ML, or dialects thereof, or any other suitable language. The interactive debugging environment may include a user interface, such as a textual, windowed, or graphic user interface, or any other suitable interface as is known in the art, to further facilitate the debugging process and to allow dynamic real-time debugging and refinement.

Once the RTFs are obtained, an annotation step may be performed, as indicated at block 260. A value of a signal at

---

```
GENERATE-REACHABLE-TARGET-FRONTIERS(δ, S₀, p)
i = 0;
Target = F₀ = {pi | pi does not satisfy p}; // F₀ represents all the states that do not satisfy p
C = { } // Target frontiers is initialized to an empty list
while (Fᵢ ≠ ∅) {
    Fᵢ₊₁ = PRE-IMG(δ, F);
    if (Fᵢ₊₁ ∩ S₀ ≠ ∅) { // the property is violated
        Fᵢ₊₁ = Fᵢ₊₁ ∩ S₀;
    j = 1;
        while (j >= 0) {
            Fⱼ = Img(δ, Fⱼ₊₁) ∩ Fⱼ;
            j= j - 1;
        C = PUSH(Fⱼ,C);
    }
    return REVERSE(C); // return Target Frontiers
    } //end the property is violated
    i = i +1;
    Fᵢ = Fᵢ - Target;
    Target = Target U Fᵢ;
}
// the property is satisfied
return C;
// return Target Frontiers that represent an empty list
``` a phase of a trace may be annotated by determining a type of influence of the signal on a property of the model that had been received as input. Some embodiments of the present invention may classify signal values at a specific phase of a counter-example trace into one of three types:

(a) "Strong Constant 0/1", or a similar or equivalent annotation, may indicate that in all counter-examples, the value of the signal at the phase of the trace is either "0" or "1", respectively.
(b) "Conditional 0/1", or a similar or equivalent annotation, may indicate that although the value of the signal at the given phase is either "0" or "1" for the given counter-example, the value of the signal at the same phase may be different for another counter-example producing the property or the failure.
(c) "Irrelevant 0/1", or a similar or equivalent annotation, may indicate that the value of the signal at the given phase is probably unrelated to the property or the failure.

It will be appreciated by persons skilled in the art that, although the scope of the invention is not limited in this regard, the above classification may be exhaustive, i.e., there may be no additional types of signal values, and not ambiguous, i.e., a signal value may not fall in two of the above types simultaneously.

Accordingly, in some embodiments of the present invention, the annotation may be performed such that the value of signal x at phase i may be classified as follows:
(a) "Strong", if $F_{i|x=0}=0$ or $F_{i|=1}=1$
(b) "Conditional", if $F_{i|x=0} \neq F_{i|x=1}$
(c) "Irrelevant", if $F_{i|x=0}=F_{i|x=1}$ (i.e., x is not in the support of $F_i$)

when $F_i$ is the RTF corresponding to phase i.

The value of the signal may be chosen according to the specific counter-example at hand. The classification into any of the categories (a) to (c), as defined above, may be performed by a post-processing step (not shown), based on all the counter-examples, as well a specific cotter-example which may be currently displayed to the user. In an exemplary embodiment of the present invention, the classification may be performed as follows:
(a) "Strong" and "Irrelevant" values may be determined by analyzing all the counter-examples. Such values may not depend on the specific counter-example displayed.
(b) "Conditional" values may be the remaining values, which were neither classified as Strong or Irrelevant. Conditional values may also be determined based on the specific counter-example displayed, i.e. the 0/1 value of Conditional values may be the one that has been chosen for the counter-example at hand.

Figure 3A:
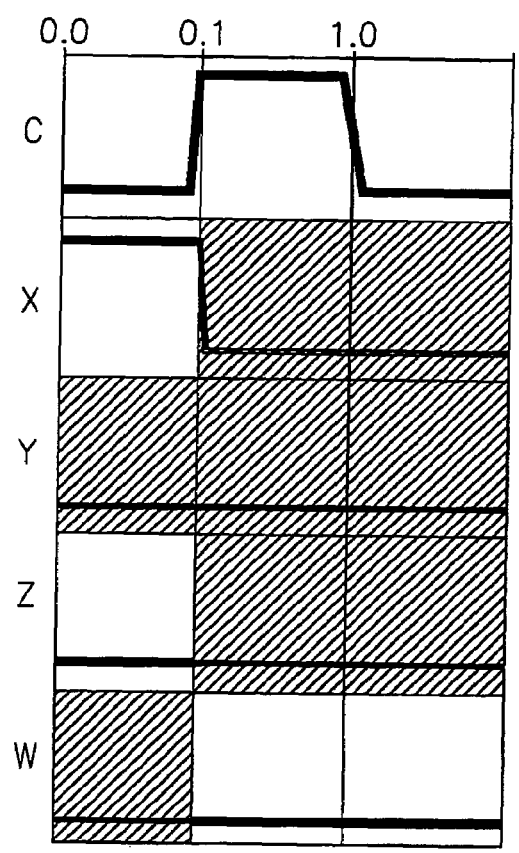
FIGS. 3A and 3B are schematic illustrations of displayed multi-value counter-example annotation schemes according to exemplary embodiments of the present invention.
Figure 3B:
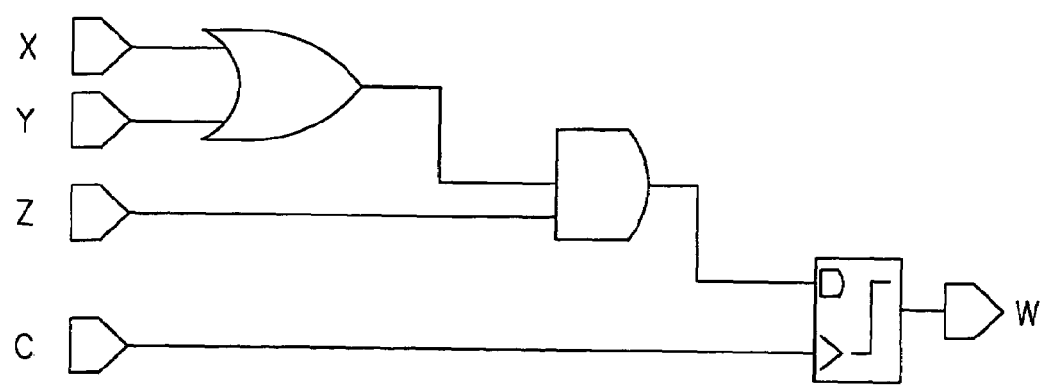

FIGS. 3A and 3B illustrate a displayed example of multi-value counter-example annotation scheme in accordance with embodiments of the invention. In FIG. 3A, "Strong" signal values are highlighted, and "Conditional" signal values and "Irrelevant" signal values are displayed in boxes with diagonal lines. In the displayed example illustrated in FIG. 3A, the analysis produced by using the MCA in accordance with embodiments of the invention may be as follows:
(a) The value of Y is Irrelevant (Y has a weak value);
(b) The values of X and Z in the second cycle are Irrelevant; and
(c) The cause of the failure is the value of Z.

It will be appreciated that signals X, Y and Z are signals of a particular exemplary design, illustrated to assist in explaining aspects of some embodiments of the present invention, and are in no way intended to limit the type of designs that may be analyzed using the systems and methods of some embodiments of the present invention. The definition of X, Y and Z, in accordance with this exemplary design may be captured by the specific logic gates illustrated in FIG. 3B.

It is noted that values annotated as "Strong" may provide the most insight on the signals that may be causing a property or a failure. For example, in some embodiments of the present invention, if a value of a signal at a phase of a counter-example trace is "Strong Zero", then changing the design so that the value of the signal at that phase will be "One" may change the property or correct the failure. Using some embodiments of the present invention, error rectification problems may be reduced to more simplified problems, for example, determining what design changes may be required to cause a signal annotated as "Strong" to shift to a different value, e.g. "Conditional" value. Hence, a benefit of embodiments of the present invention may be in facilitating the ability to manually rectify failures or properties in a convenient and straightforward manner. By making use of "Strong" annotations as guidelines, a user may try to cause the "Strong"-valued signal to produce different values, and this may often correct the failure or change the property.

Another benefit of embodiments of the present invention may be in facilitating the ability to automatically rectify spurious failures. In some embodiments of the present invention, given a MCA spurious counter-example, a higher weight may be assigned to nodes with "Strong" annotations. Then, an average weight may be computed for every node, averaging across the entire trace. Nodes with the highest weight, or nodes with a weight relatively higher than others, may be chosen for debugging or refinement. Such refinement may include, for example, adding a more detailed logical description of the nodes, reducing or altering the level of abstraction in the description of the nodes, or other methods to un-prune nodes in a given abstraction. It is noted that a refinement process may be performed by different methods, and embodiments of the present invention may facilitate the refinement process, for example, by providing "refining hints".

Some embodiments of the present invention may be implemented by software, by hardware, or by any combination of software and/or hardware as may be appropriate for specific applications or in accordance with specific design requirements. Embodiments of the present invention may include a unit to receive inputs, a unit to perform calculations and annotation, and a unit to produce output. These units may be separate of each other or combined together, in whole or in part, and may be implemented using specific, multi-purpose or general processors, or devices as are known in the art. Furthermore, the system of some embodiments of the invention may include a user interface, such as a text-based, windowed, or graphic user interface, to further facilitate an interactive debugging or refinement process. In some embodiments, the system of the invention may further include buffers and registers for temporary storage of data, as well as long-term storage solutions for dumping the results, providing printouts, or logging the process.

Some embodiments of the present invention, as detailed above, relate to the validation and rectification of counter-examples. However, other embodiments of the present invention, for example, aspects of the MCA methods and systems described above, may be suitable for use in other applications, such as, for example, validation of positive examples, validation of successful runs, and debugging or refinement of other properties.

Similarly, some embodiments of the present invention, as described herein, relate to annotations of 0/1 values. However, embodiments of the present invention may also be used in conjunction with other Boolean values, such as true/false values, or success/failure values, as are known in the art, as well as non-Boolean annotations, for example, strong/weak/irrelevant integer value annotations.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A method for VLSI logic design analysis, the method comprising:
   annotating a value at a phase of a trace of a signal by determining a type of influence of the signal on a property of a model, wherein the annotation indicates that the phase of the trace of the signal has a constant value in a plurality of counter-examples of said model; and
   based on the annotation, changing the VLSI logic design such that the value of said signal at said phase of said trace is changed from said constant value to a different value in one or more of said plurality of counter-examples of said model.

2. The method of claim 1, wherein annotating the value comprises annotating the value at a phase of a counter-example.

3. The method of claim 2, further comprising receiving the counter-example from a source of counter-examples.

4. The method of claim 3, wherein receiving the counter-example comprises receiving the counter-example from a counter-examples generator.

5. The method of claim 4, wherein receiving the counter-example from a counter-example generator comprises receiving the counter-example from a counter-example generator which produces effectively all counter-examples of a model.

6. The method of claim 1, further comprising:
   transferring data representing an annotation of the value of said signal onto a secondary device.

7. The method of claim 1, further comprising:
   debugging at least part of the model based on the annotation of the value of said signal by determining a change of the VLSI logic design that causes the value of said signal at said phase of said trace to shift from said constant value to said different value.

8. The method of claim 1, further comprising:
   refining at least part of the model based on the annotation of the value of said signal as a hint, wherein refining comprises:
   assigning weights to respective nodes of said VLSI logic design such that a higher weight is assigned to a node associated with said annotation; and
   adding a detailed logical description to one or more of said nodes having relatively higher weights to reduce a level of abstraction in a description of said nodes.

9. The method of claim 7, wherein debugging at least part of said model comprises debugging at least part of said model interactively in real time.

10. The method of claim 8, wherein refining at least part of said model comprises refining at least part of said model interactively in real time.

11. An apparatus for VLSI logic design analysis, the apparatus comprising:
    a memory unit to store a representation of the VLSI logic design; and
    a processor to execute instructions to annotate a value at a phase of a trace of a signal by determining a type of influence of the signal on a property of a model, wherein the annotation indicates that the phase of the trace of the signal has a constant value in a plurality of counter-examples of said model,
    wherein the processor executes instructions to change the VLSI logic design based on the annotation such that the value of said signal at said phase of said trace is changed from said constant value to a different value in one or more of said plurality of counter-examples of said model.

12. The apparatus of claim 11, further comprising:
    an input unit to receive a signal representing said model.

13. The apparatus of claim 11, further comprising:
    an output unit to provide an output representing values annotated by said processor.

14. The apparatus of claim 13, wherein the output unit is associated with a display.

15. The apparatus of claim 13, further comprising:
    a debugging unit to debug said model based on said output by determining a change of the VLSI logic design that causes the value of said signal at said phase of said trace to shift from said constant value to said different value.

16. The apparatus of claim 11, further comprising:
    a refining unit to refine said model based on said output by:
    assigning weights to respective nodes of said VLSI logic design such that a higher weight is assigned to a node associated with said annotation; and
    adding a detailed logical description to one or more of said nodes having relatively higher weights to reduce a level of abstraction in a description of said nodes.

17. The apparatus of claim 11, further comprising:
    a counter-examples generator to provide counter-examples to said processor.

18. The apparatus of claim 15, wherein the debugging unit debugs said model in real time.

19. The apparatus of claim 16, wherein the refining unit refines said model in real time.

20. An article for VLSI logic design analysis, the article comprising a storage medium having stored thereon instructions that, when executed by a computing platform, result in:
    annotating a value at a phase of a trace of a signal by determining a type of influence of the signal on a property of a model, wherein the annotation indicates that the phase of the trace of the signal has a constant value in a plurality of counter-examples of said model; and
    based on the annotation, changing the VLSI logic design such that the value of said signal at said phase of said trace is changed from said constant value to a different value in one or more of said plurality of counter-examples of said model.

21. The article of claim 20, wherein the instructions, when executed, further result in:
    annotating the value at a phase of a counter-example.

22. The article of claim 21, wherein the instructions, when executed, further result in:
    receiving a counter-example from a source of counter-examples.

23. The article of claim 22, wherein the instructions, when executed, further result in:
   receiving the counter-example from a counter-examples generator.

24. The article of claim 23, wherein the instructions, when executed, further result in:
   receiving the counter-example from a counter-example generator, which produces effectively all counter-examples of a model.

25. The article of claim 20, wherein the instructions, when executed, further result in:
   transferring data representing an annotation of the value of said signal onto a secondary device.

26. The article of claim 20, wherein the instructions, when executed, further result in:
   debugging at least part of the model based on the annotation of the value of said signal by determining a change of the VLSI logic design that causes the value of said signal at said phase of said trace to shift from said constant value to said different value.

27. The article of claim 20, wherein the instructions, when executed, further result in:
   refining at least part of the model based on the annotation of the value of said signal as a hint, wherein refining comprises:
   assigning weights to respective nodes of said VLSI logic design such that a higher weight is assigned to a node associated with said annotation; and
   adding a detailed logical description to one or more of said nodes having relatively higher weights, to reduce a level of abstraction in a description of said nodes.

28. The article of claim 26, wherein the instructions, when executed, further result in:
   debugging at least part of said model interactively in real time.

29. The article of claim 27, wherein the instructions, when executed, further result in:
   refining at least part of said model interactively in real time.

* * * * *